United States Patent [19]
Fahey et al.

[11] Patent Number: 5,736,301
[45] Date of Patent: Apr. 7, 1998

[54] METHOD FOR PATTERNING A PHOTORESIST MATERIAL WHEREIN AN ANTI-REFLECTIVE COATING COMPRISING A COPOLYMER OF BISPHENOL A AND BENZOPHENONE IS USED

[75] Inventors: James Thomas Fahey; Brian Wayne Herbst, both of Dutchess County; Leo Lawrence Linehan, Orange County; Wayne Martin Moreau; Gary Thomas Spinillo, both of Dutchess County, all of N.Y.; Kevin Michael Welsh, Hennepin County, Minn.; Robert Lavin Wood, Dutchess County, N.Y.

[73] Assignee: International Business Machines Corporation, Armonk, N.Y.

[21] Appl. No.: 724,275

[22] Filed: Oct. 1, 1996

Related U.S. Application Data

[62] Division of Ser. No. 281,398, Jul. 27, 1994, Pat. No. 5,607,824.
[51] Int. Cl.$^6$ .................... G03F 7/30; G03C 1/825
[52] U.S. Cl. ............. 430/325; 430/271.1; 430/326; 430/510; 430/512
[58] Field of Search ............... 430/325, 326, 430/510, 512, 271.1

[56] References Cited

U.S. PATENT DOCUMENTS

| 4,175,175 | 11/1979 | Johnson et al. | 528/125 |
|---|---|---|---|
| 4,320,224 | 3/1982 | Rose et al. | 528/125 |
| 4,668,606 | 5/1987 | DoMinh et al. | 430/512 |
| 4,702,992 | 10/1987 | Ishii et al. | 430/166 |
| 4,719,166 | 1/1988 | Blevins et al. | 430/512 |
| 4,910,122 | 3/1990 | Arnold et al. | 430/166 |
| 5,234,990 | 8/1993 | Flaim et al. | 524/609 |
| 5,498,514 | 3/1996 | Nakao et al. | 430/271.1 |
| 5,635,333 | 6/1997 | Petersen et al. | 430/325 |

*Primary Examiner*—John S. Chu
*Attorney, Agent, or Firm*—Whitham, Curtis, Whitham & McGinn; Tiffany Townsend, Esq.

[57] ABSTRACT

A co-polymer of benzophenone and bisphenol A has been shown to have DUV absorption properties. Therefore, the co-polymer has particular utility as an antireflective coating in microlithography applications. Incorporating anthracene into the co-polymer backbone enhances absorption at 248 nm. The endcapper used for the co-polymer can vary widely depending on the needs of the user and can be selected to promote adhesion, stability, and absorption of different wavelengths.

3 Claims, 1 Drawing Sheet

METHOD FOR PATTERNING A PHOTORESIST MATERIAL WHEREIN AN ANTI-REFLECTIVE COATING COMPRISING A COPOLYMER OF BISPHENOL A AND BENZOPHENONE IS USED

CROSS REFERENCE TO RELATED APPLICATION

This application is a divisional of application Ser. No. 08/281,398 filed Jul. 27, 1994, U.S. Pat. No. 5,607,824.

DESCRIPTION

BACKGROUND OF THE INVENTION

1. Field of the Invention

The invention is generally related to antireflective coatings used in microlithography processes and, more particularly, to an antireflective coating with that has light absorbing properties at deep ultraviolet (DUV) wavelengths.

2. Description of the Prior Art

Microlithography is directed to the formation of micron and sub-micron sized patterns on substrates such as semiconductor chips and wafers. Forming patterns of these small dimensions is quite difficult. Often, the surface of the substrate underlying the photoresist will have imperfections and the non-uniformity of the surface, which can sometimes be grainy or have a plurality of undulations, will result in the resist layer having a variable thickness across the surface of the substrate. The uneven topography of the underlying substrate may have variations in height of the same approximate magnitude as the light which is being used to image the photoresist material. Most photoresists are transparent to DUV radiation. Thus, when the photoresist is being patterned, the DUV radiation used to image the photoresist reflects off the surface of the underlying substrate. Silicon and aluminum, which are commonly used in integrated circuit manufacture, are highly reflective to DUV light. The reflection from the surface of the underlying substrate, together with the uneven topography of the underlying substrate, produces an uneven distribution of light in the photoresist material being imaged. This results in a large number of artifacts being produced in the resulting photoresist material.

In order to provide very high definition patterns with micron and submicron sized vias and channels, the number of artifacts produced during photoresist patterning must be minimized. Recent advances in microlithography have demonstrated that including an antireflective coating (ARC) between the photoresist and the substrate can dramatically reduce the number of artifacts in the patterned photoresist. The use of ARCs in microlithographic processes are discussed at length in the prior art. Horn, *Solid State Technology*, pp. 57–62, November, 1991, discloses that resolution better than 0.5 µm using optical lithography is dependent upon two critical processes: ARCs and planarization. The problem of reflective notching of a photoresist material resulting from light reflection from an aluminum component on a silicon substrate is specifically discussed in Horn. U.S. Pat. No. 4,609,614 to Pampalone et al. describes the use of multifunctional acrylates, methacrylate monomers, a dye, and a photoinitiator to produce an absorptive layer for optical lithography. In Pampalone et al., the photoresist layer used for patterning the substrate overlies the absorptive layer. U.S. Pat. No. 4,910,122 to Arnold et al. discloses an ARC interposed under photosensitive layers which includes a light absorbing dye. U.S. Pat. No. 5,126,289 to Ziger which discusses spinning on an ARC of at least three times the thickness of the largest surface irregularity so that the substrate/ARC combination is planar prior to photoresist application. U.S. Pat. No. 5,234,990 to Flaim et al. discloses the use of a polysulfone and polyurea polymers as an ARC.

There is a need for ARC materials which have inherent light absorbing properties provided by monomers in the polymer backbone. Prior art compositions that include dyes dispersed in a polymer carrier have the disadvantage that an extra processing step to evenly distribute the dye throughout the polymer is required, and the disadvantage that small non-uniformities in dye distribution may result in non-uniform anti-reflective properties. In addition, small molecule or monomeric dyes have a tendency to leach out during over coating with the photoresist solution. Because the thickness of the ARC layers should be kept as small as possible, slight non-uniformities in the ARC can adversely affect the patterning results. The polyurea and polysulfone polymers described in U.S. Pat. No. 5,234,990 to Flaim et al. have the advantage of some inherent light absorptive ability provided by the polymer backbone. However, these materials may not be suitable for use in many patterning processes. Thus, it would be advantageous to identify alternative polymers that are useful as ARCs.

SUMMARY OF THE INVENTION

It is an object of this invention to identify a new polymer useful as an ARC.

According to the invention, a co-polymer of a benzophenone and bisphenol-A has been found to have a high absorbance at 248 nm. Thus, this co-polymer will be useful as an ARC in microlithography applications. Including monomers with the anthracene moiety in the polymer backbone can enhance the absorbance at 248 nm.

BRIEF DESCRIPTION OF THE DRAWINGS

The foregoing and other objects, aspects and advantages will be better understood from the following detailed description of the preferred embodiments of the invention with reference to FIG. 1 which is a graph showing the linewidth variation which results when photoresists are patterned with and without the benzophenone/bisphenol-A co-polymer being used as an ARC.

DETAILED DESCRIPTION OF THE PREFERRED EMBODIMENTS OF THE INVENTION

Figure 1:
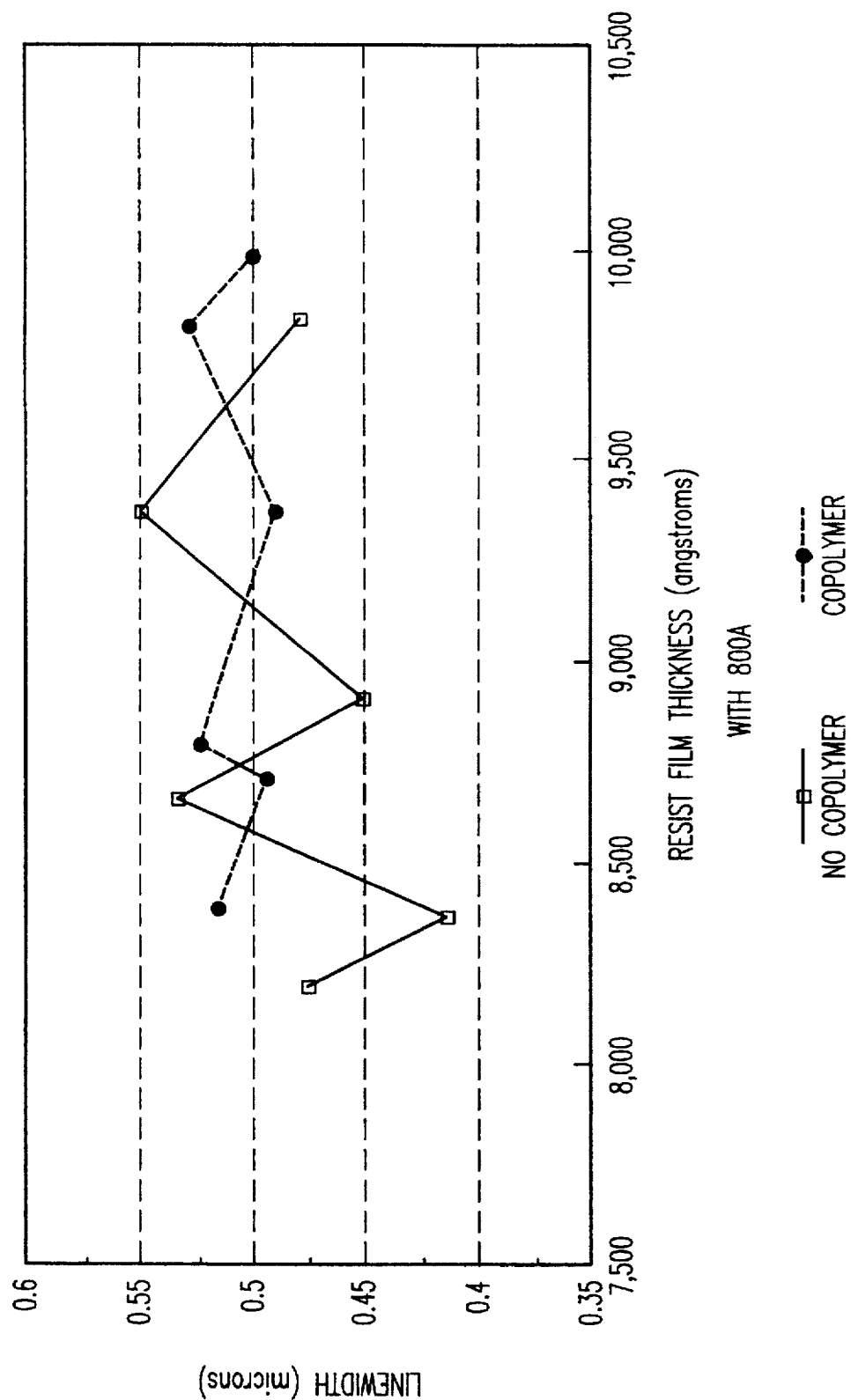

A co-polymer formed from a benzophenone and bisphenol A having the formula:

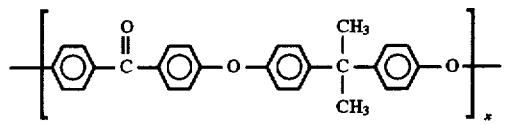

where x is greater than 1. Co-polymers having a molecular weight between 10k and 80k have been found to have ideal characteristics for use as an ARC. The co-polymer is formed by a condensation reaction of 4,4'-isopropylidine diphenol (bisphenol A monomers) and 4,4'-dihalobenzophenones (benzophenone monomers).

The bisphenol A monomer having the formula:

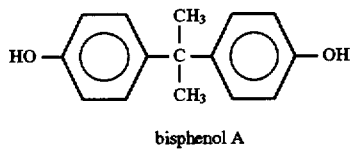

bisphenol A provides the co-polymer with solubility characteristics that allow the co-polymer to be dissolved or dispersed in a suitable carrier or solvent such as cyclic ketones (e.g., cyclopentanone or cyclohexanone). Polymers based on 4,4'-methylene diphenol (biphenol), as opposed to bisphenol-A, are inherently less soluble because of the lack of main chain flexibility that the isopropylidene structure imparts to the polymer (e.g., polymers based on biphenol are more easily crystallized). Solubility in a carrier is important to an ARC material since it will typically be applied to a substrate by spin coating, dip coating or other suitable processes, and it is essential that the coating process evenly distribute the ARC material across the substrate surface. However, the ARC polymer must also be impermeable and insoluble to typical resist casting solvents (e.g. proplyene glycol, monomethyl ether acetate, ethyl lactate, and diglyme).

The benzophenone monomer, which has a leaving group such as a halogen or the like which condenses with the hydroxyl group of the bisphenol-A, provides the co-polymer with inherent DUV absorptive properties. Preferably, the benzophenone monomer is either 4,4'dichlorobenzophenone or 4,4'-difluorobenzophenone as set forth below in the following structures:

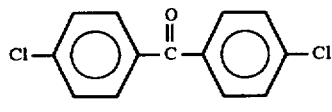

4,4'dichlorobenzophenone

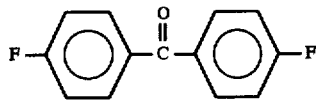

4,4'difluorobenzophenone

The benzophenone has particularly strong absorption at 248 nm. Thus, the co-polymer produced will be be particularly useful as an ARC for patterning a photoresist at 248 nm.

While the bisphenol A monomers have been described above as having hydroxy (—OH) functional groups connected to the phenyl rings and the benzophenone monomers have been described above as having halogen functional groups (e.g., —Cl —F, etc.), it is to be understood that the functionality could be reversed and the co-polymer produced would be identical. Thus, within the practice of this invention, bisphenol A monomers include both 4,4'-isopropylidine diphenol and 4,4'-dihalo isopropylidene diphenyl, and benzophenone monomers include both dihalobenzophenones and dihydroxybenzophenones.

The co-polymer is ideally produced from a composition that includes 1–50% of the bisphenol A monomer and 50–99% of the benzophenone monomers. Greater quantities of benzophenone monomers than bisphenol A monomers can be included in solution by using both dihalobenzophenones and dihydroxybenzophenones in combination with bisphenol A monomers. In this way, the benzophenone monomers can condense with each other as well as the bisphenol A monomers. It should be understood that both types of bisphenol A monomers (4,4'-isopropylidene diphenyl and 4,4'dihalo isopropylidene diphenyl) can also be present in solution.

It has also been determined that including other chromophores besides the benzophenone in the polymer backbone can result in enhanced absorptive properties. In particular, 9,10-dichloromethylanthracene, which has the formula:

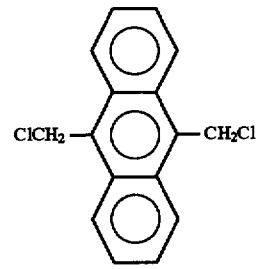

has strong absorption at 248 nm. Combining 9,10-dichloromethylanthracene with the benzophenone and bisphenol A monomers will result in a condensation co-polymer having the general formula:

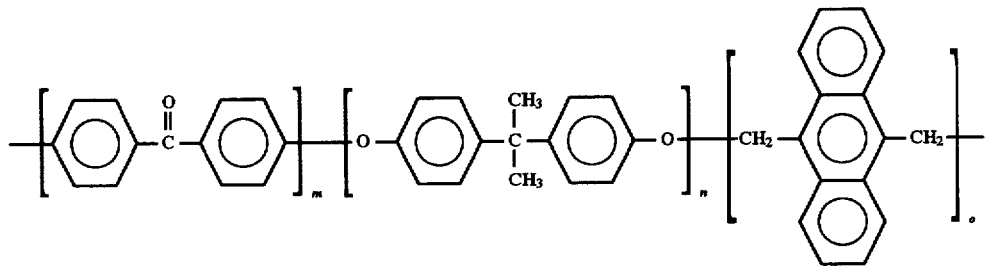

where m, n, and o reflect the relative percentages of monomer constituents in the composition and n equals the sum of m and o. Similar to the discussion above, the anthracene monomer can have hydroxy functionality instead of the halogen (chlorine) functionality indicated above. Thus, anthracene monomers may be joined with other anthracene monomers as well as both types of benzophenone monomers and both types of bisphenol A monomers. Also, similar to the discussion above, the sum of the benzophenone monomers plus anthracene monomers is preferably 50–99 wt % of the composition and the bisphenol A monomers are preferably 1–50% by weight. In co-polymers which include the anthracene monomer, it has been found to be preferable to incorporate the anthracene monomer at a rate of 1–20% into the co-polymer. Thus, a composition including 1–20% anthracene. monomer, 1–50% bisphenol A monomer, and 1–49% benzophenone monomer yields an ideal co-polymer for use as an ARC, and which has particularly strong absorption at 248 nm.

The co-polymers, which include both the bisphenol A/benzophenone and the bisphenol A/benzophenone/anthracene, can be terminated by a variety of endcapping agents. The endcapper preferably includes a halogen or other leaving group which condenses with the phenolic moiety on the bisphenol A monomer. The terminating groups may be selected to provide the co-polymer with properties tailored to specific applications. For example, when the condensation polymer is terminated with an acid, such as acetic acid, the polymer will be endcapped with hydroxy substituents. Formulating the co-polymer with an acidic endcapper allows the incorporation of reactive alkoxy silanes into the polymer for adhesion promotion. This is accomplished by the reactive phenolic polymer chain ends coupling with the silane additives. Haloalkanes ($C_nH_{(2n+1)}X$) may also be employed as endcappers for the co-polymer. Haloalkanes will produce an alkyl ether endcapped polymer that may exhibit increased stability due to its chemical neutrality. Haloalkylanthracenes, such as chloromethylanthracene, may also be used as endcappers. As discussed above in connection with the incorporation of anthracene monomers into the polymer backbone, using an anthracene endcapper for the co-polymer will provide the polymer with increased absorbance in the DUV at 248 nm. Haloalkyl coumarins, which are lactones, may also be used as endcapping agents. The haloalkyl coumarins have absorbance properties at 365 nm; thus, the co-polymer produced could be tailored to absorb light at two different wavelengths if haloalkyl coumarins were used as endcappers. Specifically, the benzophenone and anthracene monomers in the polymer backbone would absorb at 248 nm, and the alkylcoumarin endcappers would absorb at 365 nm. Haloalkyl aromatic azides may also be utilized as endcappers for terminating the co-polymer. Incorpation of the azide as an endcapper would allow the co-polymer chains to crosslink upon high temperature heating to produce a stable thermoset.

A typical formulation used as an ARC in the practice of the present invention would preferably include up to 25 wt % co-polymer in 75 wt % or more of a carrier fluid or solvent such as cyclic ketones and/or gamma butyrolactone (GBL). Other solvents which are capable of dissolving the polymer may also be useful within the practice of the invention. Other agents such as alkoxy silanes and aromatic azides may also be included to promote adhesion and cross-linking/stability. It should be understood that the weight percentages of co-polymer, carrier fluid, and other constituents can vary widely depending on the needs of the fabricator. An exemplary composition could include the following:

(1) co-polymer 0–15 wt %;

(2) cyclic ketone and/or GBL 75–100 wt %;

(3) alkoxy silane 0–3%; and (4) aromatic azide 0–20%.

The ARC composition would be applied to the suface of the substrate underneath a photoresist material to be patterned. Preferably, the thickness of the ARC composition would be two or three times the size of any imperfections on the substrate surface. The ARC composition would enhance microlithography of the overlying photoresist by absorbing DUV radiation, particularly at 248 nm.

EXAMPLE

The ability of the co-polymer of the present invention to reduce linewidth variation upon patterning a photoresist with DUV has been tested. In the experiment, a control set of six wafers was coated with varying thicknesses of a deep-UV, chemically amplified photoresist. The DUV photoresist used was APEX-E which is commercially available from Shipley Co. The wafers were patterned with a 0.37 NA Canon Excimer stepper to produce a series of 0.5 µm lines and spaces. The linewidth variation with respect to varying photoresist thickness is shown below in Table 1.

| Film Thickness (Å) | Linewidth (µm) |
|---|---|
| 8175 | 0.47 |
| 8350 | 0.41 |
| 8630 | 0.53 |
| 8890 | 0.45 |
| 9340 | 0.54 |
| 9820 | 0.47 |

A second set of six wafers was coated with 800 Å of a co-polymer of benzophenone and bisphenol A, and baked at 200° C. for 60 seconds. The wafers were then coated with various thicknesses of the same chemically amplified photoresist which was used in the control group. The wafers were then exposed in the same fashion as the control wafers. The results are shown in table 2.

| Film Thickness (Å) | Linewidth (µm) |
|---|---|
| 8360 | 0.51 |
| 8690 | 0.49 |
| 8775 | 0.52 |
| 9350 | 0.49 |
| 9790 | 0.53 |
| 9975 | 0.50 |

FIG. 1 graphically presents the data on linewidth variation from Tables 1 and 2. The wafers pre-coated with the co-polymer clearly have less line-width variation than the uncoated wafers.

While the invention has been described in terms of its preferred embodiments, those skilled in the art will recognize that the invention can be practiced with modification within the spirit and scope of the appended claims.

We claim:

1. A method of patterning a photoresist material with deep ultraviolet radiation, comprising the steps of:

applying a co-polymer comprised of bisphenol A monomers and benzophenone monomers to a surface of a substrate;

applying a photoresist over said co-polymer; and patterning said photoresist with deep ultraviolet radiation, said co-polymer reducing reflected deep ultraviolet radiation from said surface of said substrate.

2. The method of claim 1 wherein said co-polymer includes anthracene monomers.

3. The method of claim 2 wherein said co-polymer is terminated with a moiety selected from the group consisting of hydroxy, alkyl ether, alkyl anthracene, alkyl coumarin, alkyl aromatic azide, and alkoxy silane.

* * * * *

UNITED STATES PATENT AND TRADEMARK OFFICE
CERTIFICATE OF CORRECTION

PATENT NO.: 5,736,301
DATED: April 7, 1998
INVENTORS: James Thomas Fahey, Brian Wayne Herbst, Leo Lawrence Linehan, Wayne Martin Moreau, Gary Thomas Spinillo, Kevin Michael Welsh, Robert Lavin Wood It is certified that error appears in the above-identified patent and that said Letters Patent is hereby corrected as shown below.

On the title page, in the Attorney, Agent, or Firm section after "Whitham, Curtis, Whitham & McGinn" delete --Tiffany Townsend, Esq.--.

Signed and Sealed this

Sixteenth Day of June, 1998

*Attest:*

BRUCE LEHMAN

*Attesting Officer*       Commissioner of Patents and Trademarks